United States Patent
Malmqvist et al.

(10) Patent No.: US 8,072,283 B2
(45) Date of Patent: Dec. 6, 2011

(54) SIGNAL MODULATION FOR SWITCHED MODE POWER AMPLIFIERS

(75) Inventors: Hakan Malmqvist, Hagersten (SE); Leonard Rexberg, Hasselby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 143 days.

(21) Appl. No.: 12/676,005

(22) PCT Filed: Sep. 4, 2007

(86) PCT No.: PCT/SE2007/050613
§ 371 (c)(1),
(2), (4) Date: Mar. 2, 2010

(87) PCT Pub. No.: WO2009/031952
PCT Pub. Date: Mar. 12, 2009

(65) Prior Publication Data
US 2010/0201444 A1 Aug. 12, 2010

(51) Int. Cl.
*H03K 7/08* (2006.01)
*H03K 7/04* (2006.01)
*H03F 3/217* (2006.01)

(52) U.S. Cl. ........ 332/109; 332/112; 330/251; 375/238; 375/239

(58) Field of Classification Search .......... 332/109, 332/112; 327/172; 330/10, 251; 375/238, 375/239
See application file for complete search history.

(56) References Cited

U.S. PATENT DOCUMENTS

| 6,842,070 | B2 * | 1/2005 | Nilsson | 330/10 |
| 6,917,242 | B2 * | 7/2005 | Masuda et al. | 330/10 |
| 6,975,177 | B2 * | 12/2005 | Varis et al. | 332/106 |
| 7,109,789 | B2 * | 9/2006 | Spencer | 330/10 |
| 7,411,447 | B2 * | 8/2008 | Chang | 330/10 |

FOREIGN PATENT DOCUMENTS

| EP | 1271870 A2 | 1/2003 |
| WO | 2007083281 A1 | 7/2007 |
| WO | 2008051127 A1 | 5/2008 |

OTHER PUBLICATIONS

Rosnell and Varis, "Bandpass Pulse-Width Modulation (BP-PWM)," Nokia, TP Wireless Platforms, FIN-24100 Salo, Finland, pp. 731-734.

(Continued)

*Primary Examiner* — Levi Gannon
(74) *Attorney, Agent, or Firm* — Rothwell, Figg, Ernst & Manbeck, P.C.

(57) ABSTRACT

In a device (10) for modulating Cartesian base band signals (I, Q) a first and second mapping unit (12, 14) each map signal samples of a corresponding Cartesian signal (I, Q) to intermediary signal sections having only two non-zero levels provided symmetrically around zero for forming two intermediary signals (S1, S2). A first and second processing unit (16, 18) each map each intermediary sections of an intermediary signal (S1, S2) to segments of a corresponding pulse train (S3, S4) through providing a positive pulse in one half of a segment if the corresponding signal section has a positive signal level and a positive pulse in another half of the segment if the corresponding signal section has a negative signal level. A delay unit (20) delays the pulses of one train in relation to the other and a combining unit (22) combines the trains for provision to a power amplifier (24).

16 Claims, 4 Drawing Sheets

OTHER PUBLICATIONS

Notification Concerning Transmittal of International Preliminary Report on Patentability dated Mar. 18, 2010 for PCT/SE2007/050613, 7 pages.

Notification of Transmittal of the International Search Report and Written Opinion dated Jul. 4, 2008 for PCT/SE2007/050613, 11 pages.

* cited by examiner

SIGNAL MODULATION FOR SWITCHED MODE POWER AMPLIFIERS

CROSS-REFERENCE TO RELATED APPLICATION

This application is a 35 U.S.C. §371 National Phase Application from PCT/SE2007/050613, filed Sep. 4, 2007, and designating the United States.

TECHNICAL FIELD OF THE INVENTION

The present invention relates to the field of switched mode radio frequency power amplification. More particularly the present invention relates to a method of modulating a base band signal for provision to a power amplifier, a modulating device for modulating a base band signal for provision to a power amplifier as well as a switched-mode power amplifying device and a radio transmission device comprising such a modulating device.

DESCRIPTION OF RELATED ART

Switched-mode is an emerging technology for achieving high power efficiency in Radio Frequency (RF) power amplifiers. Switched-mode means that the power transistors are either in a fully conducting ON-state or in a completely shut-OFF state. The technology has the potential to reach high efficiencies, ideally up to 100%, not only at peak power but also for backed-off signals. A filter at the output is then often needed to remove unwanted harmonics of the switch frequency.

It is important to have high power efficiency for a large range of signal levels, down from maximum peak power, matching the level distributions of modern digital complex valued modulations techniques where also several channels or carriers are combined (WCDMA, OFDM). resulting in a high peak to average ratio.

An RF carrier or combination of carriers constitute a band pass RF signal. One way of a achieving such a band pass RF signal is to use Pulse Width Modulation (PWM) and Pulse Position Modulation (PPM) of a switched-mode power amplifier operating at the carrier frequency.

In a conceptual switched-mode radio architecture a general switch modulator is presenting the amplifier with a binary level signal with the correct switching positions in order for the signal after the final band pass filter to constitute the desired RF signal. In a conventional switched-mode radio architecture the phase information also needs to be converted to a pulse position either via phase modulating an oscillator working on the intended carrier frequency or by up-converting the base band signal to RF and extracting the phase information. Different variations of such conventional switched-mode techniques for radio are described in EP 1 271 870 A2, US 2004/0246060 and Rosnell, S.; Varis, J., "Band-pass pulse-width modulation (BP-PWM)", Microwave Symposium Digest, 2005 IEEE MTT-S, International, 12-17 Jun. 2005 Page(s):731-734.

Another method of achieving a band pass RF signal is to use band pass Delta-Sigma (DS) modulation working at four times the RF carrier frequency. Yet another method is to combine low pass low resolution DS modulators for separate amplitude and phase signals with a complementary discrete time low granularity PWM/PPM described in Keyzer, J.; Uang, R.: Sugiyama, Y.; Iwamoto, M.; Galton, I.; Asbeck, P.M., "Generation of RF pulsewidth modulated microwave signals using Delta-Sigma modulation" Microwave Symposium Digest, 2002 IEEE MTT-S International, Volume 1, 2-7 Jun. 2002 Page(s):397-400.

The output filter is now also needed for suppressing the out-of-band high level broadband noise generated by the DS modulation process.

One issue with a combined use of PWM and PPM with a fixed sampling period is that it inherently has a wrap-around difficulty associated with it. Either the pulse must extend over to the next sampling period or the pulse must be wrapped within the same sampling period at phase shifts close to +/−180 degrees. Phase jumps also cause problems when the phase mapping extends over the +/−180 degree border. These types of problems are not addressed in any of the above cited documents.

The phase-jump problem will be very much exacerbated when low resolution DS modulation is applied, due to the high frequency broadband noise-shaped phase signal often make multiple successive phase-jumps when the phase is close to the +/−180 degree border.

A DS modulator can not map the input signal up to full scale (FS) for stability reasons. Often the maximum stable level is less than 0.5 FS. For the phase signal in a combined polar representation DS and PWM/PWP some sort of back-off of the phase signal has to be used. The severity of the problem will lessen with more phase quantization steps.

The polar signals are very broadband, the phase signal more so (BW~fs where fs is the sampling frequency and BW the bandwidth) than the amplitude signal (BW~0.1 fs). These signals will be truncated outside the relatively narrow DS pass band (~0.05 fs) and consequently information will be lost in combination with DS modulation.

A serious problem with combined multi-step resolution DS modulation and PWM is the intermodulation (IM) induced within the pass band from the out-of-band high level DS noise and the nonlinearity of the amplitude to pulse width mapping.

This IM can not be counteracted by applying an arcsine pre-distortion since this is only accurate for a narrow band around the carrier frequency (fc=fs) placed at the first harmonic of the pulse sequence. Moreover an arcsine pre-distortion should in fact be applied to the DS amplitude levels after the DS modulator, or to the pulse widths of the PWM, and not before the DS modulator. Only for high DS resolution and high time granularity for the PWM can a pre-distorter placed before the DS somewhat alleviate the problem.

Complementing a PWM/PPM approach with DS modulation can certainly alleviate the time granularity problem for digitally defined width and positions. Otherwise for a pure PWM/PPM at least a granularity of 512 time-steps, and a corresponding high clock frequency, are required to reach 60-70 dB dynamic range When the amplitude input signal to a conventional PWM reaches zero the pulse width should also be zero. This introduces a problem to a switched-mode power amplifier, because of non-zero rise and fall times for the power transistors. The transistors will not reach the intended fully conducting ON-state or the fully OFF-state and IM will be induced due to the resulting non-linear mapping from input level to pulse area when the pulses are not reaching full amplitude.

There is therefore a need for solving one or more of the above mentioned problems.

SUMMARY OF THE INVENTION

The present invention is directed towards solving one or more problems associated with modulation of signal for switched mode power amplifiers.

One object of the present invention is to provide a method of modulating a base band signal, which solves one or more of the problems associated with prior modulation solutions.

According to a first aspect of the present invention this is achieved by a method of modulating a base band signal for provision to at least one power amplifier comprising the steps of:

receiving a base band signal provided as two Cartesian signals, separately mapping signal samples of each received Cartesian signal for forming two intermediary signals, where each sample of both Cartesian signals has been sampled using a common sampling interval, and is mapped to a corresponding intermediary signal section having one of a limited number of signal levels, said signal levels including only two non-zero levels that are separated from and provided symmetrically around zero, mapping each intermediary signal section of a corresponding intermediary signal to a segment of a corresponding pulse train, where said segment covers said sampling interval, said mapping being performed through providing a positive pulse in one half of the segment if the corresponding signal section has a positive signal level or a positive pulse in another half of the segment if the corresponding signal section has a negative signal level, forming a train of pulses made up of the pulse train segments for each intermediary signal, delaying the pulses of one of the trains in relation to the other train, and combining the two trains for provision to at least one power amplifier.

The mapping to intermediary signal sections may with advantage be provided through Delta-Sigma modulation.

Another object of the present invention is to provide a modulating device, which solves one or more of the problems associated with prior modulation solutions.

According to a second aspect of the present invention this is achieved by a modulating device for modulating a base band signal for provision to at least one power amplifier and comprising:

an input for receiving a base band signal provided as two Cartesian signals, a first and second mapping unit, each arranged to, map signal samples of a corresponding received Cartesian signal for forming two intermediary signals, where each sample of both Cartesian signals has been sampled using a common sampling interval, and said mapping involves mapping a signal sample to a corresponding intermediary signal section having one of a limited number of signal levels including only two non-zero levels that are separated from and provided symmetrically around zero, a first and a second processing unit, each arranged to, map each intermediary section of a corresponding intermediary signal to a segment of a corresponding pulse train, where each segment covers said sampling interval and said mapping involves providing a positive pulse in one half of the segment if the corresponding signal section has a positive signal level or a positive pulse in another half of the segment if the corresponding signal section has a negative signal level, and form a train of pulses made up of the signal train segments for the corresponding intermediary signal, a delay unit arranged to delay the pulses of one of the trains in relation to the other train, and a combining unit arranged to combine the two trains for provision to at least one power amplifier.

The first and second mapping units may with advantage be Delta-Sigma modulators.

The modulating device may with advantage be provided in a switched-mode power amplifying device as well as in a radio transmission device such as a base station or a mobile station.

The invention has the following advantages. By providing positive pulses that occupy different halves of a segment, the previously mentioned wrap-around and phase-jump problems are avoided. This also significantly simplifies the total radio architecture. Through the shifting of one pulse train in relation to the other pulse train, the proper quadrature phase relation in the combined signal is achieved. By restricting the number of quantization step to two or three, the processing units can be simplified and the optimisation need only to be focused on the mapping units. This simplifies the achieving of a high efficiency of the amplifier stage. This feature of the invention furthermore allows the removal of an arcsine predistorter, normally used in pulse width modulation for band pass RF signals. This may be done because all nonlinear anti-symmetric functions (in this case the mapping from input levels onto pulse widths) pass through the quantisation levels used.

It should be emphasized that the term "comprises/comprising" when used in this specification is taken to specify the presence of stated features, steps or components, but does not preclude the presence or addition of one or more other features, steps, components or groups thereof.

BRIEF DESCRIPTION OF THE DRAWINGS

The present invention will now be described in more detail in relation to the enclosed drawings, in which.

DETAILED DESCRIPTION OF EMBODIMENTS

The present invention relates to a modulating device provided for a switched mode RF (radio frequency) power amplifier that can be used advantageously for communication in wireless networks for instance in 2.5 G networks and above. One exemplifying problem with RF power amplifiers when used in combination with PWM modulation is the above mentioned wrap-around problem. The present invention is directed towards improving on this situation.

Figure 1:
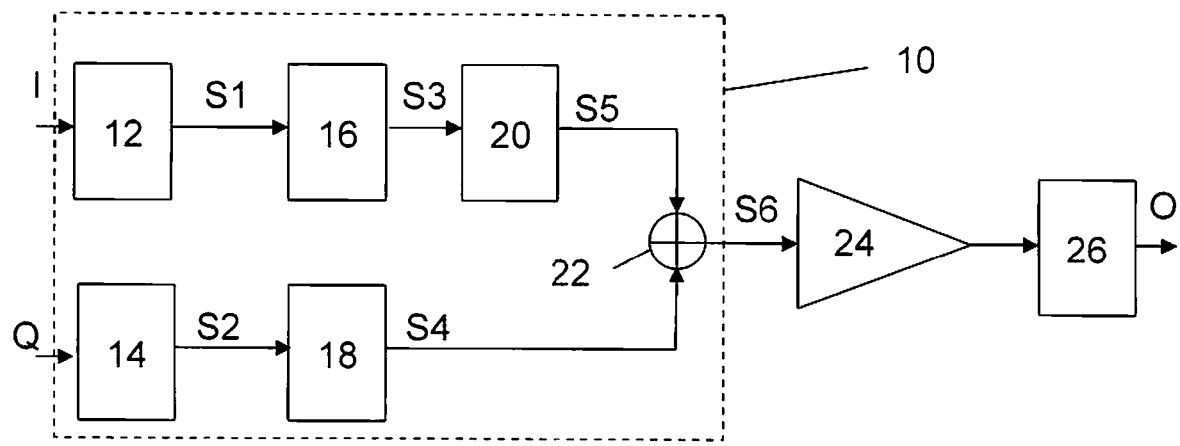
FIG. 1 shows a block schematic of a modulation device according to a first embodiment of the present invention and being connected to a switch mode power amplifier and to a filter, FIG. 2 schematically shows a number of signals provided by the modulation device according to the first embodiment of the present invention, FIG. 3 schematically shows a flow chart of a method of modulating a signal according to the present invention.

A modulating device 10 according to a first embodiment of the present invention is shown in a block schematic in FIG. 1 and being connected to a switched-mode power amplifier 24 and to an output filter 26. The modulating device 10 is indicated by a dashed box including a number of different units. The modulating device 10 includes an input for receiving the signal samples of the I (In-phase) and Q (quadrature) signals of a base band signal. It should here be realised that the modulating device may also include a sampling unit for taking these samples of the base band signal. Alternatively the samples may be taken by another device outside of the modulating unit. According to the present invention the base band signal is provided as a pair of Cartesian signals and not as a pair of polar signals. The device 10 is provided with a first mapping unit 12 and a second mapping unit 14 for receiving the I signal samples and for receiving the Q signal samples, respectively. The first mapping unit 12 is connected to a first processing unit 16, which in turn is connected to a delay unit 20. In order to process the Q signal samples the second mapping unit 14 is connected to a second processing unit 18. The second processing unit 18 and the delay unit 20 are furthermore connected to a first combining unit 22. The first combining unit is furthermore connected to a switched mode power amplifier 24, which provides an RF output signal 0 via a filter 26. The first and second mapping units 12 and 14 are here preferably provided as Delta-Sigma modulating units. However, it should be realised that also other types of modulation may be used according to the present invention.

Figure 2:
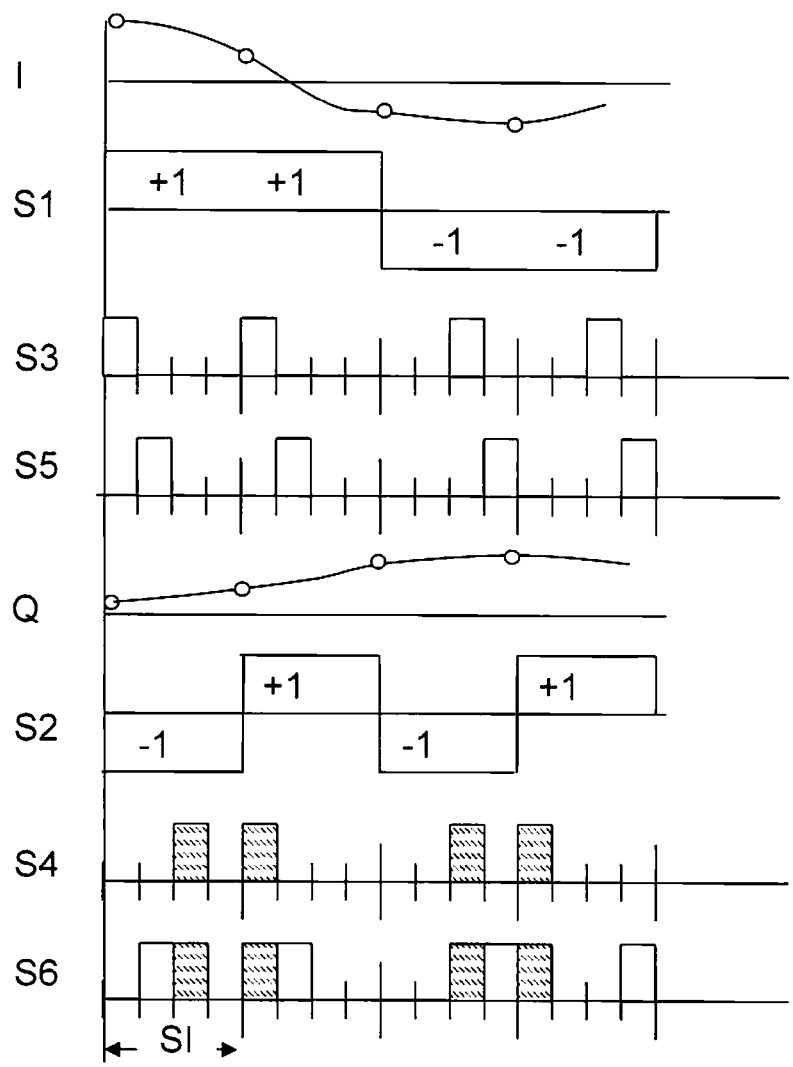
Figure 3:
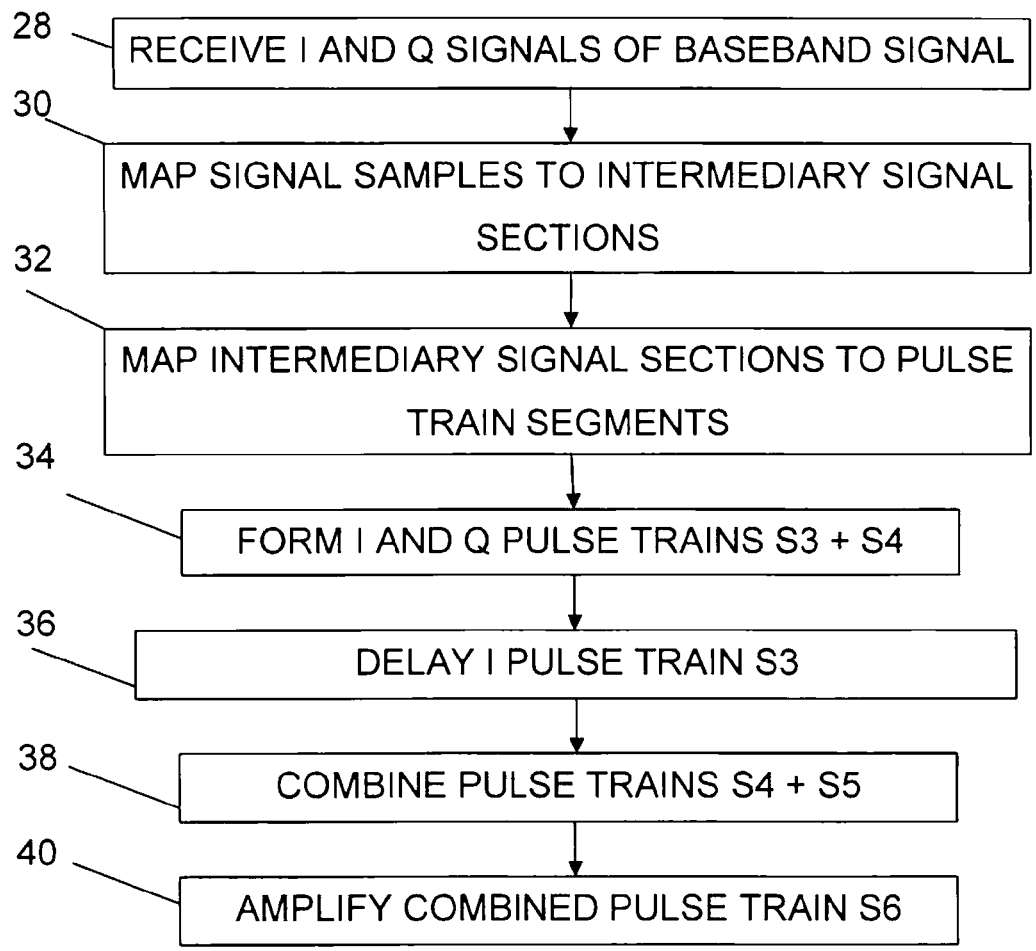

The operation of the device 10 in FIG. 1 will now be described with reference being made also to FIG. 2, which shows a number of signals appearing in FIG. 1 as well as to FIG. 3, which shows a flow chart of a number of method steps performed in a method of modulating a base band signal according to the first embodiment of the present invention.

The first and second mapping units 12 and 14 first receive the signal samples of the Cartesian signals I and Q, step 28. The signal samples are here sampled with a common and fixed sampling interval SI. This means that the same sampling interval SI is used for all samples. The first mapping unit 12 then maps the signal samples of the I signal for forming a first intermediary signal S1 and the second mapping unit 14 maps the signal samples of the Q signal for forming a second intermediary signal S2, step 30. According to the first embodiment of the present invention the samples are in this mapping mapped to two normalized levels that are provided symmetrically around zero. The mapping is bipolar. Here they are both mapped to a normalized level +1 and −1. It should however be realised that any other levels may be provided as long as they are symmetrical around zero and have the same absolute value.

From these signal samples there are therefore provided two intermediary signals S1 and S2 that are made up of a number of sections, where each section has the length of the sampling interval SI. Each section here corresponds to the mapping of one sample. Each intermediary signal section is thus here provided with an even positive signal level for a positive signal sample and an even negative signal level for a negative signal sample. As can be seen from FIG. 2, exemplifying I signal samples may be mapped to a signal having the sections +1, +1, −1 and −1, while exemplifying Q signal samples may be mapped to a signal S2 having sections −1, +1, −1, +1. This mapping is in this example made according to normal Delta-Sigma modulation principles to two bipolar levels. Thus it is clear that the first and second mapping units 12 and 14 have two quantisation levels +1 and −1. The intermediary signal S1 corresponding to the I signal samples is then provided to the first processing unit 16, while the intermediary signal S2 corresponding to the Q signal samples is provided to the second processing unit 18.

Both the first and the second processing units 16 and 18 here map the intermediary signal sections of the intermediary signals S1 and S2 to pulse train segments of pulse trains S3 and S4, step 32. These segments here have the length or cover the sampling interval SI. In this mapping the mapping is performed in the following way. If an intermediary section being processed has a positive level, here +1, a positive pulse is generated that is provided in one half of the segment, here the first half, and preferably in a first quarter of the segment. If instead an intermediary section has a negative level, here −1, then also a positive pulse is generated. However the pulse is here provided in another half of the segment, and here the second half. This pulse is here preferably also provided in the third quarter of the segment. Each segment may therefore be seen has having a number of slots, where each slot may correspond to a quarter of the sampling interval SI. Thus a pulse for a positive signal section is provided in a first slot of a half and a pulse for a negative signal section is provided in a first slot of the other half of a segment. All the pulses of the pulse trains may furthermore have the same pulse widths.

The different sections of the intermediary signals S1 and S2 are in this way mapped to different segments for forming the I and Q pulse trains S3 and S4. As the signal S1 is exemplified with four sections, the signal S3 is exemplified as having four slots, each corresponding to a quarter of a segment. As the signal S1 has the exemplifying levels +1, +1, −1 and −1, the signal S3 will have a positive pulse in the first quarters of the first and second segments and a positive pulse in the third quarters of the third and fourth segments. In a similar manner, since the signal S2 has the exemplifying levels −1, +1, −1 and +1, the signal S4 will have a positive pulse in the first quarters of the second and fourth segments and a positive pulse in the third quarters of the first and third segments. The processing units can be provided in the form of PWM circuits that are complemented with pulse placing functionality. Since the pulse widths are the same for all segments, they are furthermore easy to implement. However, it should be realised that since the pulses do have the same widths, the processing unit is not limited to using PWM, but can be simplified in that pulses of a pre-known fixed width may be generated for an intermediary signal section, where only the placing in a segment is decided by the polarity of the section.

Since the I and Q signals are signals that are separated in phase by ninety degrees, it is possible to combine them into one signal through delaying one of the signals in relation to the other, where the result of the delay should then be that one pulse train is provided a quarter of a sample interval after the other. For this reason the delay unit 20 here delays the I pulse train S3 with a quarter of the sampling interval SI or with a quarter of a segment, step 36, the result of which is shown in signal S5. The delayed I pulse train S5 and the Q pulse train S4 are then combined in the first combining unit 22, step 38, so that the pulses are added to each other, resulting in the combined pulse train S6. Since the pulses of the I pulse train here will end up in either the second or fourth slots of the segments, there will not be any overlap. This pulse train combination S6 is then provided to the switched-mode power amplifier 24, which amplifies it, step 40. The amplified combined pulse train is then bandpass filtered by a filter 26 and provided as an output signal O, which is a resulting RF bandpass output signal O.

According to the invention separate paths are maintained for In-phase (I) and Quadrature (Q) branches through the mapping and processing units and these paths are then combined after the mapping performed by the processing units, in order to generate band pass RF signals from Cartesian base band signals. By always providing positive pulses that occupy different quarters of a segment, the previously mentioned wrap-around and phase-jump problems are avoided. This also significantly simplifies the total radio architecture. Through the shifting of I pulse train in relation to the Q pulse train the proper quadrature phase relation in the combined signal, namely I+jQ is achieved. The number of quantization steps are restricted to two, here with the normalized values −1 and +1. The discrete time granularity of the processing units may also be restricted to four time-steps, each one ¼ of the sampling interval SI, corresponding to the used time-shift positions. The pulses will then also have a fixed-width of ¼ of SI in order to fit into these positions. Therefore the processing unit can be simplified and provided without using conventional PWM modulation with continuous or high granularity digitally defined pulse widths. The optimisation need then only to be focused on the mapping units, which with advantage can be Delta-Sigma modulators. This simplifies the achieving of a high efficiency of the amplifier stage. The invention furthermore allows the removal of an arcsine pre-distorter, normally used in PWM for band pass RF signals. This may be done because all nonlinear anti-symmetric functions (in this case the mapping from input levels onto pulse widths) pass through the points −1 and +1. Furthermore an arcsine pre-distortion would be detrimental to performance, since it in fact should be applied to the quantization levels or pulse widths and not to the signal before the first mapping.

In some situations it may be preferable to use more than the two quantisation levels mentioned above. In this case it is furthermore in certain situations not viable to map the quantisation levels to only unipolar pulses in a segment, since it may lead to intermodulation in the pass band from out-of-band high level noise emanating from the mapping units and the nonlinearity of the three-level to unipolar pulse mapping (in effect a half-wave rectification)

A second embodiment of the present invention that addresses this situation will now be described with reference being made to FIG. 4, which shows a block schematic of a modulation device 10' according to a second embodiment of the present invention being connected to a pair of switch mode power amplifiers 24A and 24B and to a filter 26 as well as to FIG. 5, which schematically shows a number of signals provided by the modulation device according to the second embodiment of the present invention.

Figure 4:
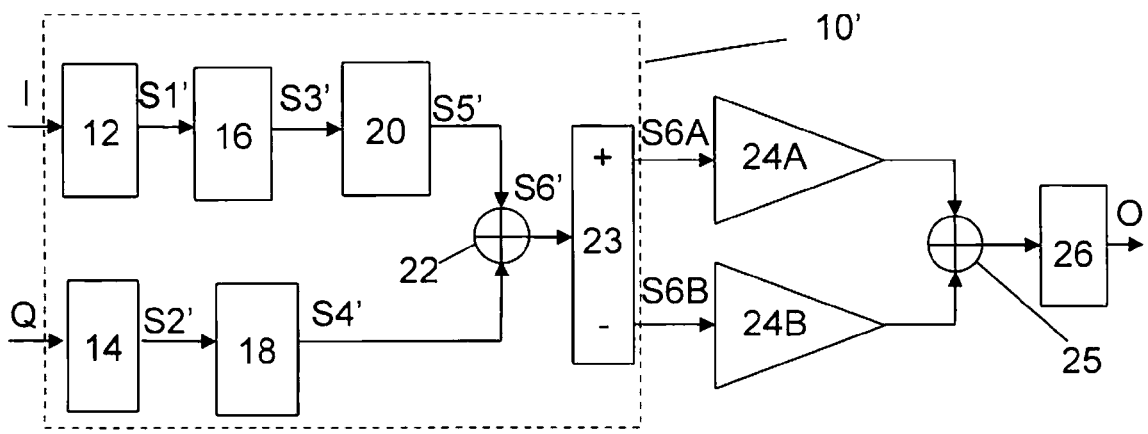
FIG. 4 shows a block schematic of a modulation device according to a second embodiment of the present invention and being connected to a pair of switch mode power amplifiers and to a filter, FIG. 5 schematically shows a number of signals provided by the modulation device according to the second embodiment of the present invention.

The device 10' in FIG. 4 differs from the device 10 in FIG. 1 through including a splitting unit 23 connected to the first combining unit 22. The splitting unit is then connected to a first 24A and to a second switched-mode power amplifier 24B, which are both connected to a second combining unit 25 that is finally connected to the filter 26. The second combining unit 25 is here shown as being provided outside of the modulating device 10'.

Figure 5:
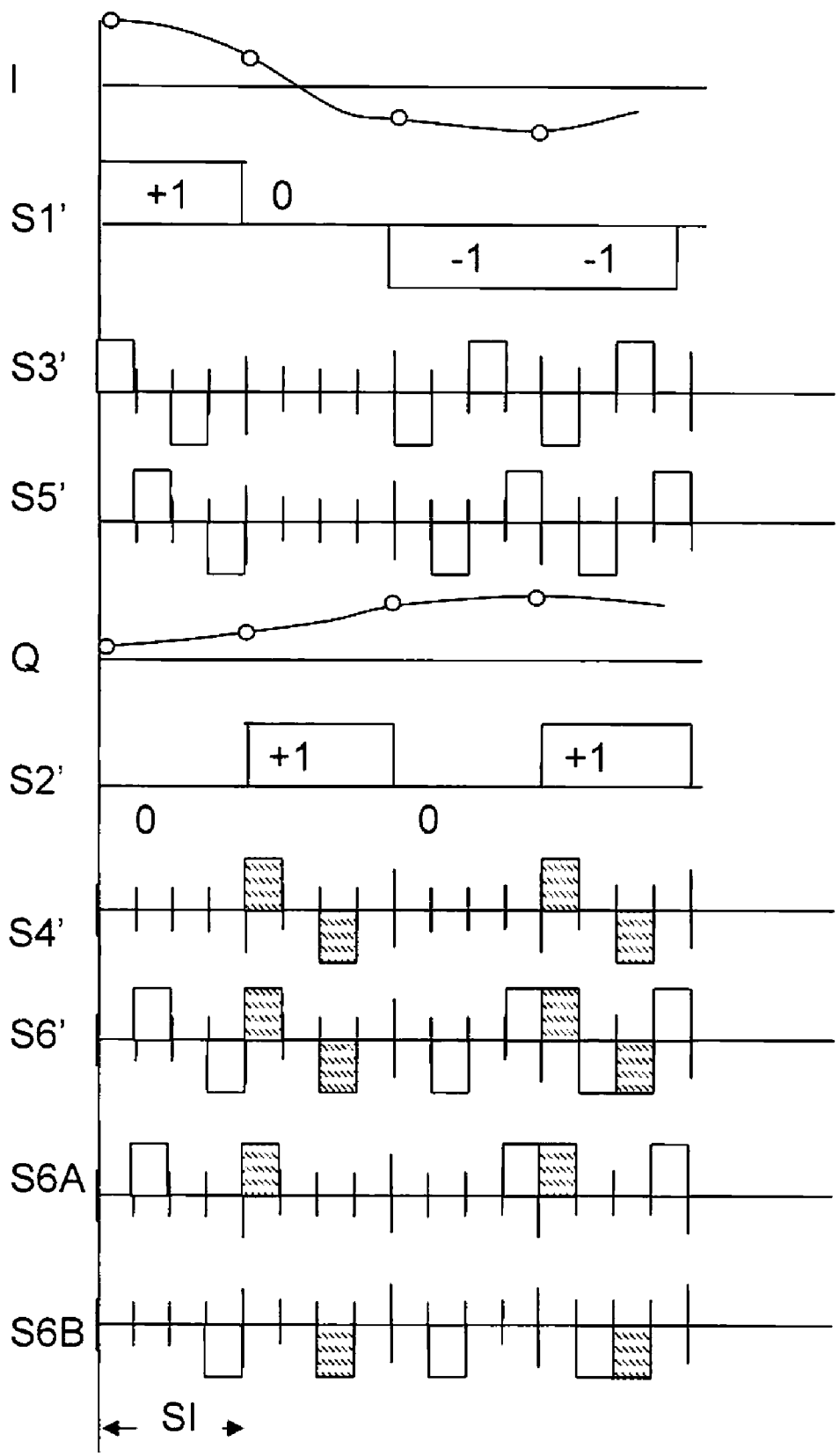

In operation there are a few differences as are evident from FIG. 5.

As in the first embodiment, the first and second mapping unit 12 and 14 first receive the signal samples of the I and Q signals and map them for providing intermediary signals S1' and S2'. According to this second embodiment of the present invention the samples are mapped to a number of quantisation levels. Here two of the levels are provided symmetrically around zero as +1 and −1 like in the first embodiment. However, here there is also a third level that is here an even zero level. As can be seen from FIG. 5, the exemplifying I signal samples may be mapped to an intermediary signals S1' having the sections +1, 0, −1 and −1, while the exemplifying Q signal samples may be mapped to an intermediary signal S2' having sections 0, +1, 0 and +1. Both the first and the second processing units 16 and 18 thus map the intermediary signal sections of the intermediary signals S1' and S2' to pulse train segments of pulse trains S3' and S4'. In this mapping the mapping is performed in the following way. If an intermediary section being processed has a positive level, i.e. +1, a positive pulse is generated that is provided in one half of the segment, here the first half, and preferably in a first quarter of the segment. However for a positive level, there is here also provided an additional negative pulse in the other half of the segment and here the second half. This negative pulse is then preferably also in the third quarter of the segment. If instead an intermediary section has a negative level, i.e. −1, then as before there is a positive pulse in the other half of the segment, and here the second half. It is here preferably also in the third quarter of the segment. However for a negative level there is also provided an additional negative pulse in said one half of the segment, here the first half, and preferably in a first quarter of the segment. Finally a zero level leads to the provision of no pulses. Instead an empty segment is provided. The I and Q pulse trains S3' and S4' are then formed from these different sections. As the exemplifying signal S1' has the levels +1, 0, −1 and −1, the signal S3' has a positive pulse in the first quarter of the first segment and a negative pulse in the third quarter of the first segment, an empty second segment and a positive pulse in the third quarters of the third and fourth segments as well as a negative pulse in the first quarters of the third and fourth segments. In a similar manner, since the signal S2' has the levels 0, +1, 0 and +1, the signal S4' has a positive pulse in the first quarters of the second and fourth segments and a negative pulse in the third quarter of the second and fourth segments, while the first and third segments are empty.

Delaying in the delay unit 20 and combining in the first combining unit 22 are then performed in the same way as in the first embodiment. However, since the combined pulse train S6' has both positive and negative pulses, it is hard to get linear amplification in a single amplifier. Therefore the combined pulse train S6' is provided to a splitting unit 23, which separates the positive pulses from the negative pulses and thus provides a positive pulse train S6A including all the combined positive pulses and a negative pulse train S6B including all the combined negative pulses. The positive pulse train S6A is thus provided to the first power amplifier 24A, while the negative pulse train S6B is provided to the second power amplifier 24B, which amplify the signals S6A and S6B. Thereafter the amplified positive and negative pulse trains are combined in order to recreate an amplified combined pulse train, which after bandpass filtering in filter 26 is provided as the output signal O.

With the provision of three levels a better mapping of the samples is made. The second embodiment allows this to be provided without any loss of efficiency. Otherwise the same advantages are obtained as in the first embodiment.

The mapping unit, may as mentioned above be provided in the form of a Delta-Sigma modulator, while the processing units may be provided as an band-pass PWM modulator. The different PWM output pulse patterns described above in fact create the necessary and wanted up-converting from baseband to the band-pass RF signal, thus constituting a band-pass PWM. The whole modulating device may with advantage be implemented through one or more processors with associated computer program code for performing the above described modualting functionalty. The device can also be provided through a properly programmed FPGA (Field Progammable Gate Array) or an ASIC (Application Specific Integrated Circuit) circuit.

The above mentioned modulating device has several further advantages. The dynamic range in the pass band is ideally defined only by the noise shaping filter of the mapping units. The mapping units have a fairly large stable maximum bandwidth (~0.05 fs where fs is the sampling frequency). For 3-level quantization the mapping units have a fairly large stable maximum level (~0.7 fs). No arcsine pre-distortion is necessary for Cartesian mapping to segments combined with 2 or 3-level quantization levels. A Cartesian processing unit with time granularity 4 (i.e. ¼ of SI) and with fixed pulse widths will be almost trivial to implement as there is only one pulse width to handle by using two or three quantisation levels. The I and Q branch pulses are easily put together to a composed pulse train in the processing units as they are placed at different slots in each sampling interval (SI). Digital logic needs to operate at only the carrier frequency, except for the processing unit output stage that needs clocking at 4 times the carrier frequency. The used single pulse width of ¼ SI will solve the mentioned problem with short pulse inputs to the switching power amplifier when the signal level passes through zero.

Figure 6:
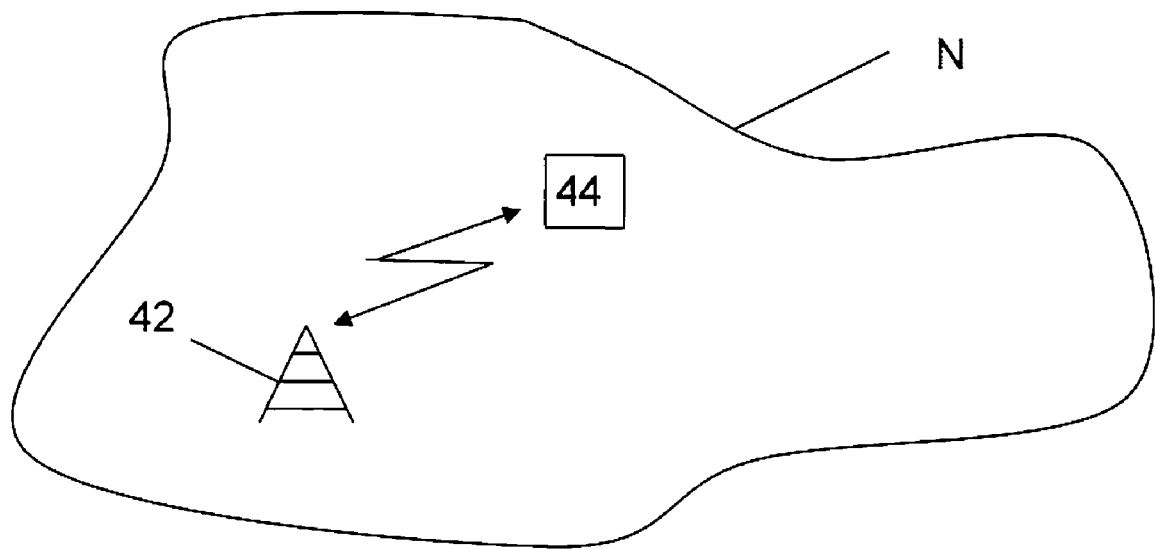
FIG. 6 shows two radio transmission devices, one base station and one mobile station communicating with each other, where each may include a modulating device according to the present invention.

The modulating device according to the invention may be provided in either a base station or a mobile station or in both. FIG. 6 schematically shows one such base station 42 communicating with a mobile station 44 in a wide area network N. Here both these are provided with a modulating device according to the invention as well as at least one switched-mode power amplifier. The mobile station may also be a cellular phone.

There are a number of further variations that can be made to the present invention. It is possible to vary the first described embodiment through mapping three quantisation levels to one positive pulse in a segment (with zero being mapped as an empty segment). This is possible for low demand applications. It is naturally also possible to modify the second embodiment for only using two quantisation levels, in which case there will be no empty segments. Naturally the placing of pulses in a segment may be varied. The positive pulse of a segment (for a positive section) may thus be provided in the second half and the positive pulse of a segment (for a negative section) may be provided in the first half. Similarly the negative pulse of a segment (for a positive section) may be provided in the first half and negative pulse of a segment (for a negative section) may be provided in the second half.

Although the present invention has been described in connection with specific embodiments, it is not intended to be limited to the specific form set forth herein. Rather, the scope of the present invention is limited only by the accompanying claims.

The invention claimed is:

1. A method of modulating a base band signal for provision to at least one power amplifier comprising the steps of:
receiving a base band signal provided as two Cartesian signals,
separately mapping signal samples of each received Cartesian signal for forming two intermediary signals, where each sample of both Cartesian signals
has been sampled using a common sampling interval, and
is mapped to a corresponding intermediary signal section having one of a limited number of signal levels, said signal levels including only two non-zero levels that are separated from and provided symmetrically around zero,
mapping each intermediary signal section of a corresponding intermediary signal to a segment of a corresponding pulse train, where said segment covers said sampling interval, said mapping being performed through providing
a positive pulse in one half of the segment if the corresponding signal section has a positive signal level or
a positive pulse in another half of the segment if the corresponding signal section has a negative signal level,
forming a train of pulses made up of the pulse train segments for each intermediary signal,
delaying the pulses of one of the trains in relation to the other train, and
combining the two trains for provision to at least one power amplifier.

2. The method according to claim 1, wherein the step of separately mapping signal samples of each received Cartesian signal for forming two intermediary signals is performed using Delta-Sigma modulation.

3. The method according to claim 1, wherein a pulse for a positive signal section is provided in a first slot of the corresponding half and a pulse for a negative signal section is provided in a first slot of the corresponding half in each segment.

4. The method according to claim 3, wherein the step of delaying involves shifting a pulse with a quarter of a segment.

5. The method according to claim 1, wherein one of the intermediary signal levels is a zero level and no pulses are formed for this zero level.

6. The method according to claim 5, wherein the step of mapping intermediary signal sections to pulse train sections comprises creating an empty segment for each intermediary signal section having said zero level.

7. The method according to claim 1, wherein each segment in which pulses are provided further includes two pulses, an additional negative pulse in said other half if the corresponding signal section has a positive signal level or an additional negative pulse in said one half if the corresponding signal section has a negative signal level.

8. The method according to claim 7, further comprising the step of separating negative pulses from positive pulses of the combined trains for provision to separate power amplifiers.

9. The method according to claim 8, further comprising the step of separately amplifying the separated positive and negative pulses and combining these amplified pulses in order to provide an output signal.

10. A modulating device for modulating a base band signal for provision to at least one power amplifier and comprising:
an input for receiving a base band signal provided as two Cartesian signals,
a first and second mapping unit, each arranged to,
map signal samples of a corresponding received Cartesian signal for forming two intermediary signals,
where each sample of both Cartesian signals has been sampled using a common sampling interval, and
said mapping involves mapping a signal sample to a corresponding intermediary signal section having one of a limited number of signal levels including only two non-zero levels that are separated from and provided symmetrically around zero,
a first and a second processing unit, each arranged to,
map each intermediary section of a corresponding intermediary signal to a segment of a corresponding pulse train, where each segment covers said sampling interval and said mapping involves providing
   a positive pulse in one half of the segment if the corresponding signal section has a positive signal level or
   a positive pulse in another half of the segment if the corresponding signal section has a negative signal level, and
   form a train of pulses made up of the pulse train segments for the corresponding intermediary signal,
a delay unit arranged to delay the pulses of one of the trains in relation to the other train, and
a combining unit arranged to combine the two trains for provision to at least one power amplifier.

11. The modulating device according to claim 10, wherein each first and second processing unit when performing said mapping is further arranged to provide an additional negative pulse in said other half of the segment if the corresponding signal section has a positive signal level or an additional negative pulse in said one half of the segment if the corresponding signal section has a negative signal level.

12. The modulating device according to claim 10, wherein the first and second mapping units are Delta-Sigma modulators.

13. A switched-mode power amplifying device comprising the modulating device according to claim 10 and at least one switched power amplifier.

14. A radio transmission device comprising a modulating device according to claim 10.

15. The radio transmission device according to claim 14, wherein it is a base station.

16. The radio transmission device according to claim 14, wherein it is a mobile station.

* * * * *

UNITED STATES PATENT AND TRADEMARK OFFICE
CERTIFICATE OF CORRECTION

| | | |
|---|---|---|
| PATENT NO. | : 8,072,283 B2 | Page 1 of 1 |
| APPLICATION NO. | : 12/676005 | |
| DATED | : December 6, 2011 | |
| INVENTOR(S) | : Malmqvist et al. | |

It is certified that error appears in the above-identified patent and that said Letters Patent is hereby corrected as shown below:

On the Title Page, in item (75), under "Inventors", in Column 1, Line 1,
delete "Hakan Malmqvist, Hagersten" and
insert -- Håkan Malmqvist, Hägersten --, therefor.

On the Title Page, in item (75), under "Inventors", in Column 1, Line 2,
delete "Hasselby" and insert -- Hässelby --, therefor.

In Column 1, Line 38, delete "OFDM)." and insert -- OFDM), --, therefor.

In Column 1, Line 66, delete "R.:" and insert -- R.; --, therefor.

In Column 2, Line 44, delete "PWM" and insert -- PWM, --, therefor.

In Column 5, Line 26, delete "signal 0" and insert -- signal O --, therefor.

Signed and Sealed this
First Day of January, 2013

David J. Kappos
*Director of the United States Patent and Trademark Office*